(12) United States Patent
Ji et al.

(10) Patent No.: US 10,998,267 B2
(45) Date of Patent: May 4, 2021

(54) WAFER-LEVEL CHIP-SIZE PACKAGE WITH REDISTRIBUTION LAYER

(71) Applicant: MediaTek Inc., Hsin-Chu (TW)

(72) Inventors: Yan-Liang Ji, Hsinchu (TW); Ming-Jen Hsiung, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/286,844

(22) Filed: Oct. 6, 2016

(65) Prior Publication Data
US 2017/0263523 A1   Sep. 14, 2017

Related U.S. Application Data

(60) Provisional application No. 62/306,657, filed on Mar. 11, 2016.

(51) Int. Cl.
*H01L 23/528* (2006.01)
*H01L 23/48* (2006.01)
(Continued)

(52) U.S. Cl.
CPC ...... *H01L 23/5283* (2013.01); *H01L 23/3192* (2013.01); *H01L 23/481* (2013.01);
(Continued)

(58) Field of Classification Search
CPC .... H01L 24/05; H01L 23/5283; H01L 23/481
See application file for complete search history.

(56) References Cited

U.S. PATENT DOCUMENTS

| 7,977,789 B2* | 7/2011 | Park | H01L 24/05 |
| | | | 257/737 |
| 8,227,918 B2* | 7/2012 | Lu | H01L 24/05 |
| | | | 257/738 |

(Continued)

FOREIGN PATENT DOCUMENTS

| CN | 101231971 A | 7/2008 |
| CN | 105047643 A | 11/2015 |

(Continued)

OTHER PUBLICATIONS

Extended European Search Report dated Jun. 14, 2017 in connection with European Application No. 16199543.6.

*Primary Examiner* — Mark W Tornow
*Assistant Examiner* — Abbigale A Boyle
(74) *Attorney, Agent, or Firm* — Wolf, Greenfield & Sacks, P.C.

(57) ABSTRACT

A wafer-level chip-size package includes a semiconductor structure. A bonding pad is formed over the semiconductor structure, including a plurality of conductive segments. A conductive component is formed over the semiconductor structure, being adjacent to the bonding pad. A passivation layer is formed, exposing a portions of the conductive segments of the first bonding pad. A conductive redistribution layer is formed over the portions of the conductive segments of the first bonding pad exposed by the passivation layer. A planarization layer is formed over the passivation layer and the conductive redistribution layer, exposing a portion of the conductive redistribution layer. A UBM layer is formed over the planarization layer and the portion of the conductive redistribution layer exposed by the planarization layer. A conductive bump is formed over the UBM layer.

6 Claims, 13 Drawing Sheets

(51) Int. Cl.
*H01L 23/00* (2006.01)
*H01L 23/31* (2006.01)

(52) U.S. Cl.
CPC .............. *H01L 24/02* (2013.01); *H01L 24/03* (2013.01); *H01L 24/05* (2013.01); *H01L 24/08* (2013.01); *H01L 24/11* (2013.01); *H01L 24/17* (2013.01); *H01L 23/3171* (2013.01); *H01L 24/13* (2013.01); *H01L 24/94* (2013.01); *H01L 2224/0235* (2013.01); *H01L 2224/02351* (2013.01); *H01L 2224/03452* (2013.01); *H01L 2224/03462* (2013.01); *H01L 2224/0401* (2013.01); *H01L 2224/05008* (2013.01); *H01L 2224/05022* (2013.01); *H01L 2224/05078* (2013.01); *H01L 2224/05082* (2013.01); *H01L 2224/05088* (2013.01); *H01L 2224/05095* (2013.01); *H01L 2224/05096* (2013.01); *H01L 2224/05552* (2013.01); *H01L 2224/05569* (2013.01); *H01L 2224/05572* (2013.01); *H01L 2224/131* (2013.01); *H01L 2224/94* (2013.01)

(56) References Cited

U.S. PATENT DOCUMENTS

| | | | |
|---|---|---|---|
| 8,450,849 | B2 | 5/2013 | Lu et al. |
| 9,035,471 | B2* | 5/2015 | Topacio .................. H01L 24/17 |
| | | | 257/786 |
| 2003/0133115 | A1* | 7/2003 | Chen .................... G01B 11/272 |
| | | | 356/401 |
| 2011/0063815 | A1 | 3/2011 | Lu et al. |
| 2012/0228763 | A1 | 9/2012 | Akiyama et al. |
| 2013/0187269 | A1 | 7/2013 | Lin et al. |
| 2015/0228594 | A1 | 8/2015 | Alvarado et al. |
| 2015/0325537 | A1* | 11/2015 | Lu ........................ H01L 23/528 |
| | | | 257/737 |
| 2016/0133618 | A1 | 5/2016 | Miao et al. |

FOREIGN PATENT DOCUMENTS

| | | |
|---|---|---|
| TW | 201535600 A | 9/2015 |
| TW | 201541590 A | 11/2015 |
| WO | WO 2014/174825 A1 | 10/2014 |

* cited by examiner

WAFER-LEVEL CHIP-SIZE PACKAGE WITH REDISTRIBUTION LAYER

CROSS REFERENCE TO RELATED APPLICATIONS

This application claims the benefit of U.S. Provisional Application No. 62/306,657 filed Mar. 11, 2016, the entirety of which is incorporated by reference herein.

BACKGROUND OF THE INVENTION

Field of the Invention

The present invention relates to integrated circuits (ICs), and in particular to a wafer-level chip-size package (WLCSP) with a redistribution layer and a method for forming the same.

Description of the Related Art

The desire to make electronic products small, lightweight, and high-performing has developed into a desire to make electronic parts small, lightweight, and high-performing. This desire has caused developments to proceed in various packaging technologies, along with developments in the technologies related to designing and manufacturing semiconductors. Representative examples of packaging technologies include the ball grid array (BGA), the flip-chip, and the chip size package (CSP) based on area array and surface-mount packaging.

Among the above, the CSP is a packaging technology that enables a small package to be the same size as the real chip to be developed. In particular, in a wafer-level chip-size package (WLCSP), the packaging is performed in a wafer level so that the packaging costs per chip can be remarkably reduced. Typically, the WLCSP includes a redistribution layer (RDL) wiring traces, an under bump metallurgy (UBM) layer forming a bump, and a passivation layer protecting a circuit.

BRIEF SUMMARY OF THE INVENTION

An exemplary wafer-level chip-size package comprises a semiconductor structure, a bonding pad, a conductive component, a passivation layer, a conductive redistribution layer, an under-bump-metallurgy (UBM) layer, and a conductive bump. The bonding pad is formed over the semiconductor structure and comprises a plurality of conductive segments. The conductive component is formed over the semiconductor structure, and is adjacent to the bonding pad. The passivation layer is formed over the semiconductor structure, the first bonding pad and the conductive component, and exposes portions of the conductive segments of the first bonding pad. The conductive redistribution layer is formed over the passivation layer and the portions of the conductive segments of the first bonding pad exposed by the passivation layer. The planarization layer is formed over the passivation layer and the conductive redistribution layer, and exposes a portion of the conductive redistribution layer. The UBM layer is formed over the planarization layer and the portion of the conductive redistribution layer exposed by the planarization layer. The conductive bump is formed over the UBM layer.

An exemplary method for forming a wafer-level chip-size package comprises providing a semiconductor structure having a bonding pad and a conductive component formed over the semiconductor structure, wherein the bonding pad comprises a plurality of conductive segments, and the conductive component is adjacent to the bonding pad. The method further comprises forming a passivation layer over the semiconductor structure, the bonding pad, and the conductive component, wherein the passivation layer exposes a plurality of portions of the conductive segments of the bonding pad. The method further comprises forming a conductive redistribution layer over the passivation layer and the portions of the conductive segments of the bonding pad exposed by the passivation layer. The method further comprises forming a planarization layer over the passivation layer and the conductive redistribution layer, and exposing a portion of the conductive redistribution layer. The method further comprises forming an under-bump-metallurgy (UBM) layer over the portion of the conductive redistribution layer exposed by the planarization layer. The method further comprises forming a conductive bump formed over the UBM layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
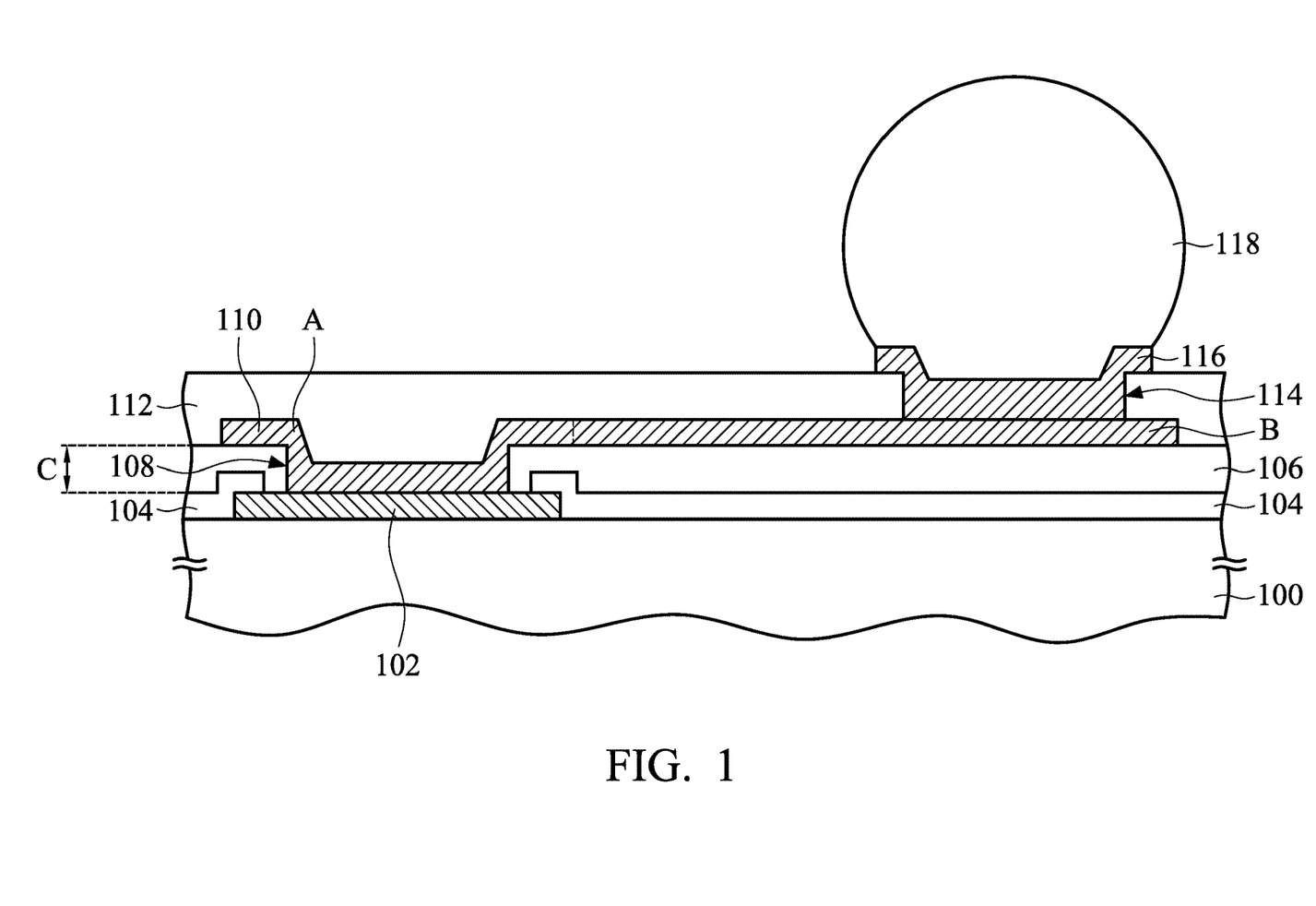
FIG. 1 is a schematic cross section showing a wafer-level chip-size package (WLCSP) according to an embodiment of the present disclosure.

FIG. 1 is a schematic cross section showing a wafer-level chip-size package (WLCSP) according to an embodiment of the present disclosure.

As shown in FIG. 1, the WLCSP comprises a semiconductor structure 100, a bonding pad 102, a passivation layer 104, a first planarization layer 106, a second planarization layer 112, a conductive redistribution layer 110, an under-bump-metallurgy (UBM) layer 116, and a conductive bump 118.

Herein, the semiconductor structure 100 is illustrated as a structure having a flat top surface for the purpose of simplifying the figure. It should be noted that the semiconductor structure 100 can be a wafer-level semiconductor substrate having a plurality of semiconductor devices and interconnect structures (both not shown) formed thereon. The semiconductor devices formed over the semiconductor substrate 100 can be, for example, active devices such as transistors or diodes and/or passive devices such as capacitors, resistors and conductors. The interconnect structures in the semiconductor structure 100 may comprise a multi-layer metallization structure isolated and supported by a plurality of interlayer dielectric layers. In this embodiment, only a portion of the semiconductor structure 100 is illustrated as the WLCSP.

Referring to FIG. 1, the bonding pad 102 is formed over a portion of the semiconductor structure 100 and may be electrically connected with one of the interconnect structure (not shown) of a circuit formed in the semiconductor structure 100. The passivation layer 104 and the first planarization layer 106 are sequentially formed over the semiconductor structure 100, and the passivation layer 104 and the first planarization layer 106 partially respectively cover portions of the bonding pad 102. An opening 108 is formed in the first planarization layer 106 to expose a portion of the bonding pad 102, and the conductive redistribution layer 110 is conformably formed over portions of the first planarization layer 106 and in the opening to cover the portion of the bonding pad 102 exposed by the opening 108. The second planarization layer 112 is formed over the first planarization layer 106 and the conductive redistribution layer 110, and an opening 114 is formed in the second planarization layer 112 to expose a portion of the conductive redistribution layer 110. The UBM layer 116 is formed over a portion of the second planarization layer 112 and the portion of the conductive redistribution layer 110 exposed by the second planarization layer 112, and the conductive bump 118 is formed over the UBM layer 116.

In this embodiment, the bonding pad 102 may comprise conductive materials such as aluminum, and the passivation layer 104 may comprise dielectric materials such as silicon oxide, silicon nitride, or a combination thereof. The first planarization layer 106 and the second planarization layer 112 may comprise dielectric materials such as silicon nitride, silicon oxide, or polymer. In one embodiment, the polymer suitable for the first planarization layer 106 and the second planarization layer 112 can be, for example, polyimide, polybenzoxazole or benzocyclobutene. The conductive redistribution layer 110 may comprise conductive materials such as copper, nickel, or aluminum. The UBM layer 116 may comprise conductive materials such as metals or metal alloys such as Ni layers, Ag layers, Al layers, Cu layers or alloys thereof, or materials of doped polysilicon, monocrystalline silicon or conductive glasses. Additionally, refractory metal materials such as titanium, molybdenum, chromium or titanium tungsten layers can be used to individually form the UBM layers or be combined with other metal layers. Typically, the first planarization layer 106 is provided with a thickness C of about 5 µm to about 7.5 µm, and the step-height of the first planarization layer 106 over the bonding pad 102 is too great, and as a result the opening 108 formed in the first planarization layer 106 is smaller than the opening formed in the passivation layer 104, having a size of, for example, about µm to about Therefore, the conductive redistribution layer 110 is conformably formed over portions of the first planarization layer 106 and the portion of the bonding pad 102 exposed by the opening 108 and has a step portion A of a step-like configuration near the opening 108 and a planar portion B of a flat configuration extending from the opening 114 and over the first planarization layer 106. In addition, the opening 114 formed in the second planarization layer 112 exposes a portion of the planar portion B of the conductive redistribution layer 110, so that the UBM layer 116 can be conformably disposed over portions of the second planarization layer 112 and the planar portion B of the conductive redistribution layer 110 exposed by the opening 114.

In the WLCSP shown in FIG. 1, since the first planarization layer 106, having a thickness C of about 5 µm to about 7.5 µm is provided, the step-height of the first planarization layer 106 near the opening 108 is too great to make the opening 108 smaller. Thus, the portion of the conductive redistribution layer 110 near the opening 108 is formed with a step-like configuration, and the UBM layer 116 and the solder bump 118 formed over the UBM layer only can be formed over the planar portion B of the conductive redistribution layer 110 extending from the opening 108 and over the first passivation layer 106. Moreover, since the opening formed in the passivation layer 104 needs to be formed in a size that is greater than the size of the opening 108 formed in the first planarization layer 106, the bonding pad 102 exposed by the opening formed in the passivation layer 104 will be provided with a configuration as a large-sized conductive pad with only one electrical potential during operation of the WLCSP shown in FIG. 1. Therefore, the footprint of the WLCSP shown in FIG. 1 is quite large and there is no chance for forming another conductive component adjacent to the bonding pad 102 for providing another electrical potential during operation of the WLCSP shown in FIG. 1, which is undesirable because of the trend towards further reduction in the size of the integrated circuits in the WLCSP.

Therefore, FIGS. 2-8 are schematic cross sections showing a method for forming a wafer-level chip-size package (WLCSP) having an additional conductive component adjacent to the bonding pad for providing another electrical potential that is different from that of the bonding pad, according to another embodiment of the present disclosure.

Figure 2:
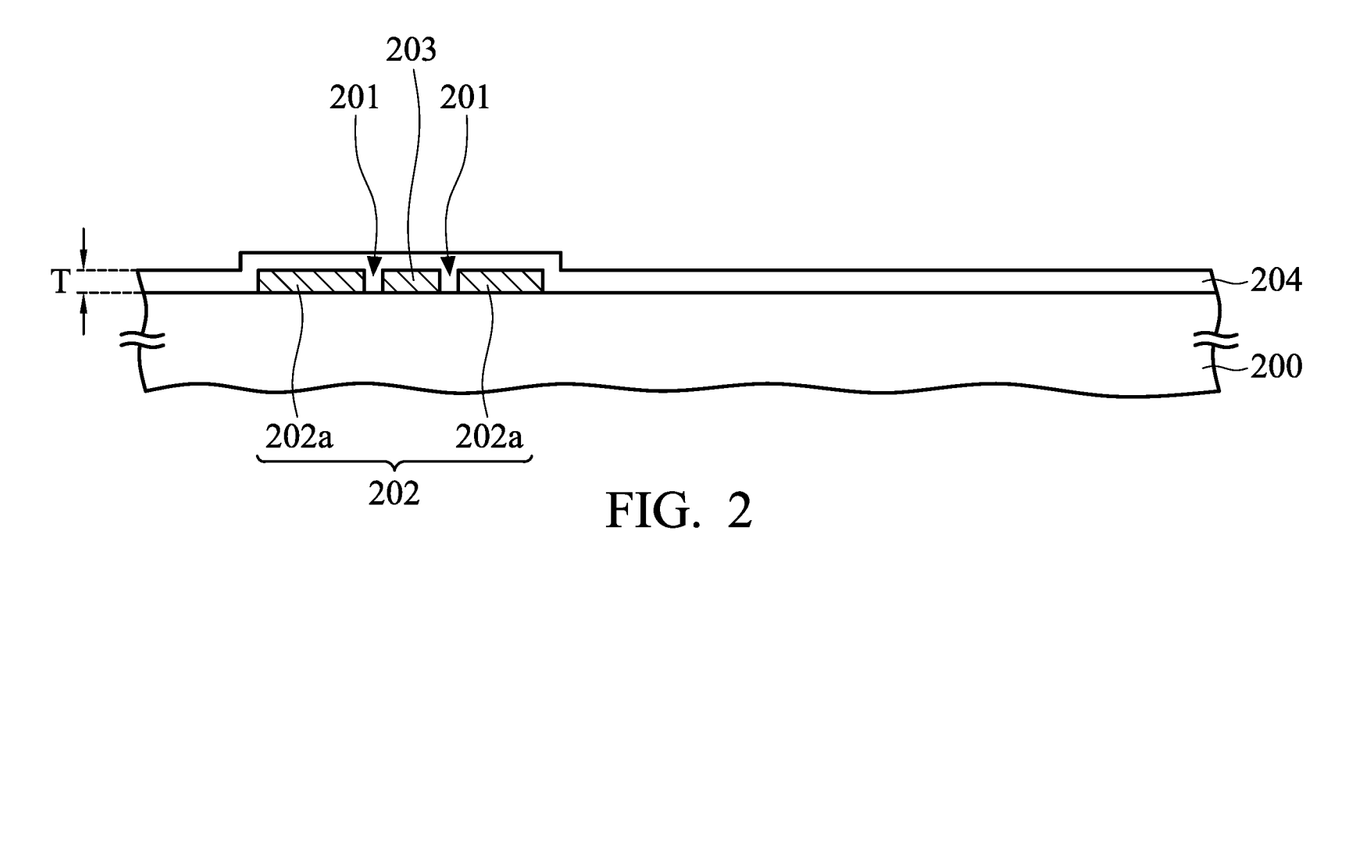
FIGS. 2-8 are a schematic cross sections showing a method for forming a wafer-level chip-size package (WLCSP) according to an embodiment of the present disclosure.

Referring to FIG. 2, a semiconductor structure 200 having a bonding pad 202 and a conductive component 203 formed over various portions of the semiconductor structure 200 is provided. The bonding pad 202 comprises a plurality of conductive segments 202a separately formed over the semiconductor structure 200 and the conductive component 203 is adjacent to the bonding pad 202. In one embodiment, as shown in FIG. 2, the bonding pad 202 comprises two conductive segments 202a formed over various portions of the semiconductor structure 200, and the conductive component 203 is formed over the semiconductor substrate 200 at a place between the conductive segments 202a of the bonding pad 202. The conductive component 203 is isolated from the two conductive segments 202a of the bonding pad 202 by a trench 201 formed between the conductive component 203 and one of the conductive segments 202a of the bonding pad 202. The conductive component 203 and the conductive segments 202a of the bonding pad 202 comprises the same conductive materials such as Al, Cu or W, and can be simultaneously formed.

Still referring to FIG. 2, a passivation layer 204 is next conformably formed over the semiconductor structure 200, the bonding pad 202, and the conductive component 203 by, for example, a chemical vapor deposition (CVD) process (not shown). The passivation layer 204 is conformably formed over the semiconductor structure 200, the bonding pad 202, and the conductive component 203, and fills each of the trenches 201. As shown in FIG. 2, the passivation layer 204 has a non-planar top surface over the semiconductor structure 200. In one embodiment, the portion of the passivation layer 204 formed over the semiconductor structure 200 has a thickness T of about 0.8 µm to about 4 µm.

In one embodiment, the semiconductor structure 200 is the same as the semiconductor structure 100 shown in FIG. 1, and materials for forming the passivation layer 204, and the bonding pad 202 and the conductive component 203 are similar with those used for forming the passivation layer 104 and the bonding pad 102 shown in FIG. 1.

Figure 3:
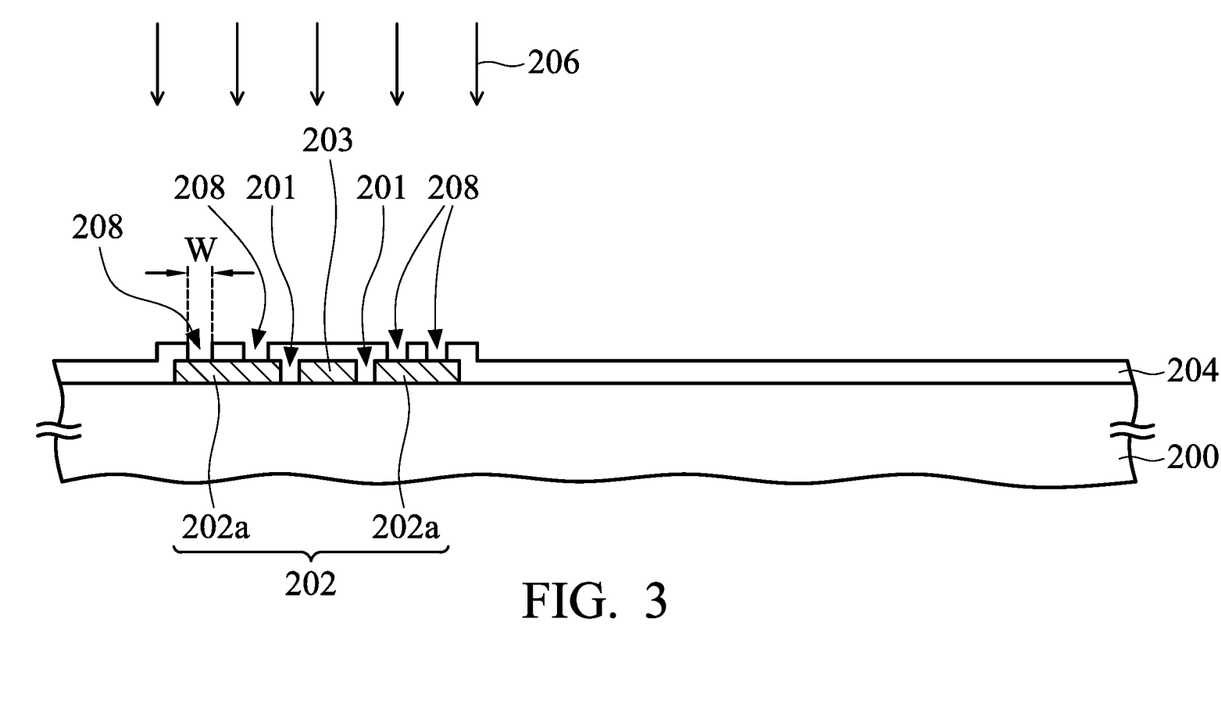

Referring to FIG. 3, a patterning process 206 is next performed on the passivation layer 204 shown in FIG. 2 to form a plurality of openings 208 only in portions of the passivation layer 204 over the conductive segments 202a of the bonding pad 202.

As shown in FIG. 3, the openings 208 respectively expose a portion of the conductive segments 202a of the bonding pad 202. However, there is no opening 208 formed in the portion of the passivation layer 204 over the conductive component 203, and so the conductive component 203 is still covered by the passivation layer 204 and will not be exposed by the openings 208. Each of the openings 208 has a dimension W, for example a width, of about 2 µm to about 90 µm, and the openings 208 may have a circular, stripe-like, or polygonal shape from a top view (not shown). In one embodiment, the patterning process 206 may comprise photolithography and etching steps (not shown) with suitable patterned masks (not shown) used as an etching mask (not shown).

Figure 4:
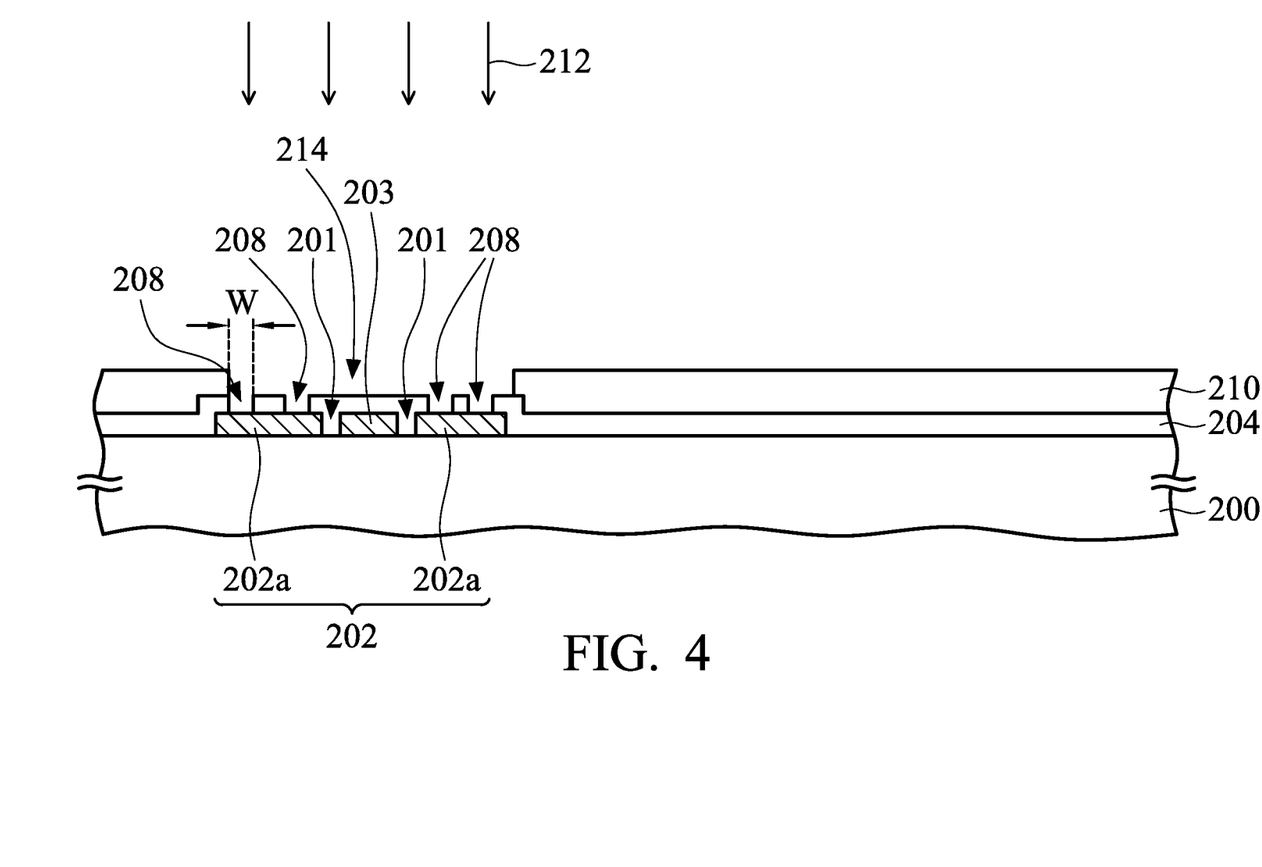

Referring to FIG. 4, a first planarization layer 210 is formed over the top surface of the structure shown in FIG. 3, and a patterning process 212 is next performed on the first planarization layer 210 to form an opening 214 in a portion of the first planarization layer 210, thereby exposing the portion of the passivation layer 204 formed over the conductive components 203 and the conductive segments 202a of the bonding pad 202, the openings 208, and the portions of the conductive segments 202a of the bonding pad 202 exposed by the opening 208. The first planarization layer 210 can be formed by chemical vapor deposition (CVD) or spin coating, for example, and may be patterned by the patterning process 212 comprising photolithography and etching steps (not shown) incorporating suitable patterned masks (not shown) as an etching mask. Materials for forming the first planarization layer 210 can be the same as those of the first planarization layer 106 shown in FIG. 1, and the first planarization layer 210 may have a thickness of about µm to about µm.

Figure 5:
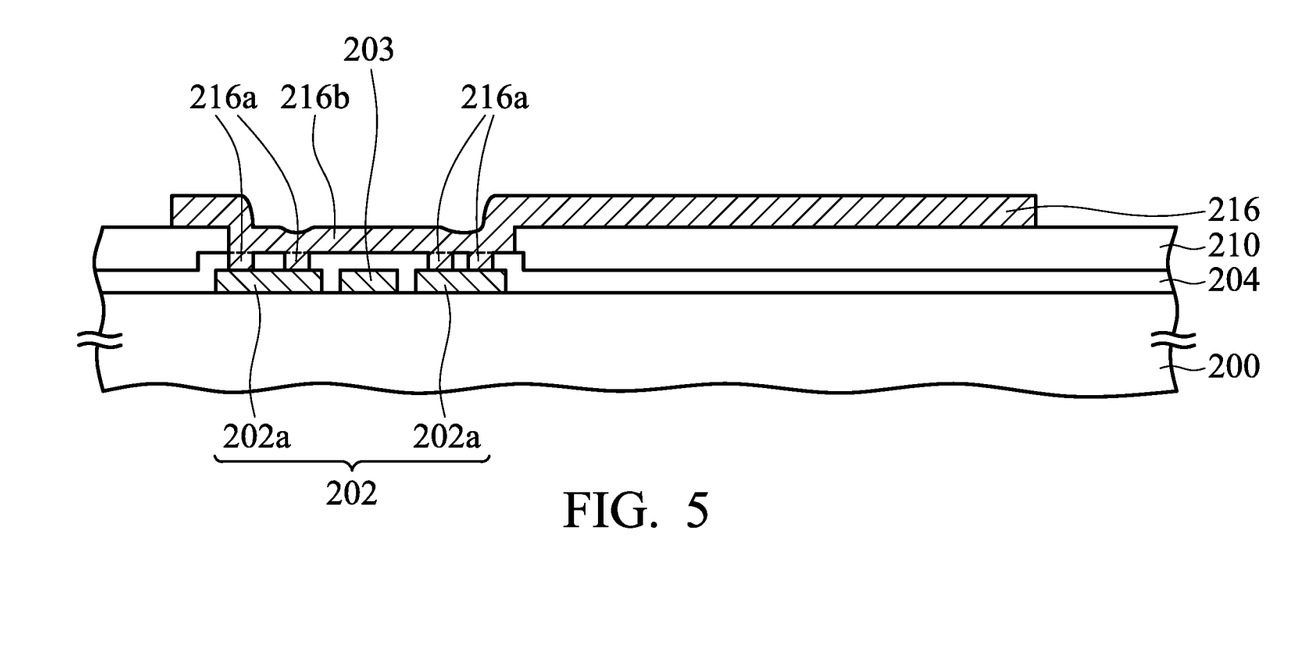

Referring to FIG. 5, a patterned conductive redistribution layer 216 is next formed over portions of the passivation layer 204 exposed by the opening 214 and portions of the first planarization layer 210. As shown in FIG. 5, the portion of the patterned conductive redistribution layer 216 formed in the opening 214 fills the openings 208 exposing the portions of the conductive segments 202a of the bonding pad 202 and covers the portion of the passivation layer 204 formed over the conductive components 203, comprising a plurality of first portions 216a filling the openings 208 formed in the passivation layer 204, and a second portion 216b formed above the flat top surface of the passivation layer 204 and the openings 208. Therefore, the patterned conductive redistribution layer 216 is also provided with a conformal top surface, as shown in FIG. 5. The patterned conductive redistribution layer 216 can be formed by first forming a conductive redistribution layer over the passivation layer 204 and in the openings 208, and then the conductive redistribution layer is patterned by a patterning process (not shown) comprising photolithography and etching steps (not shown) incorporating suitable patterned masks (not shown) as an etching mask. Conductive materials for forming the patterned conductive redistribution layer 216 can be the same as those of the conductive redistribution layer 110 shown in FIG. 1, with a thickness of about 4 µm to about 9 µm above the passivation layer 204.

Figure 6:
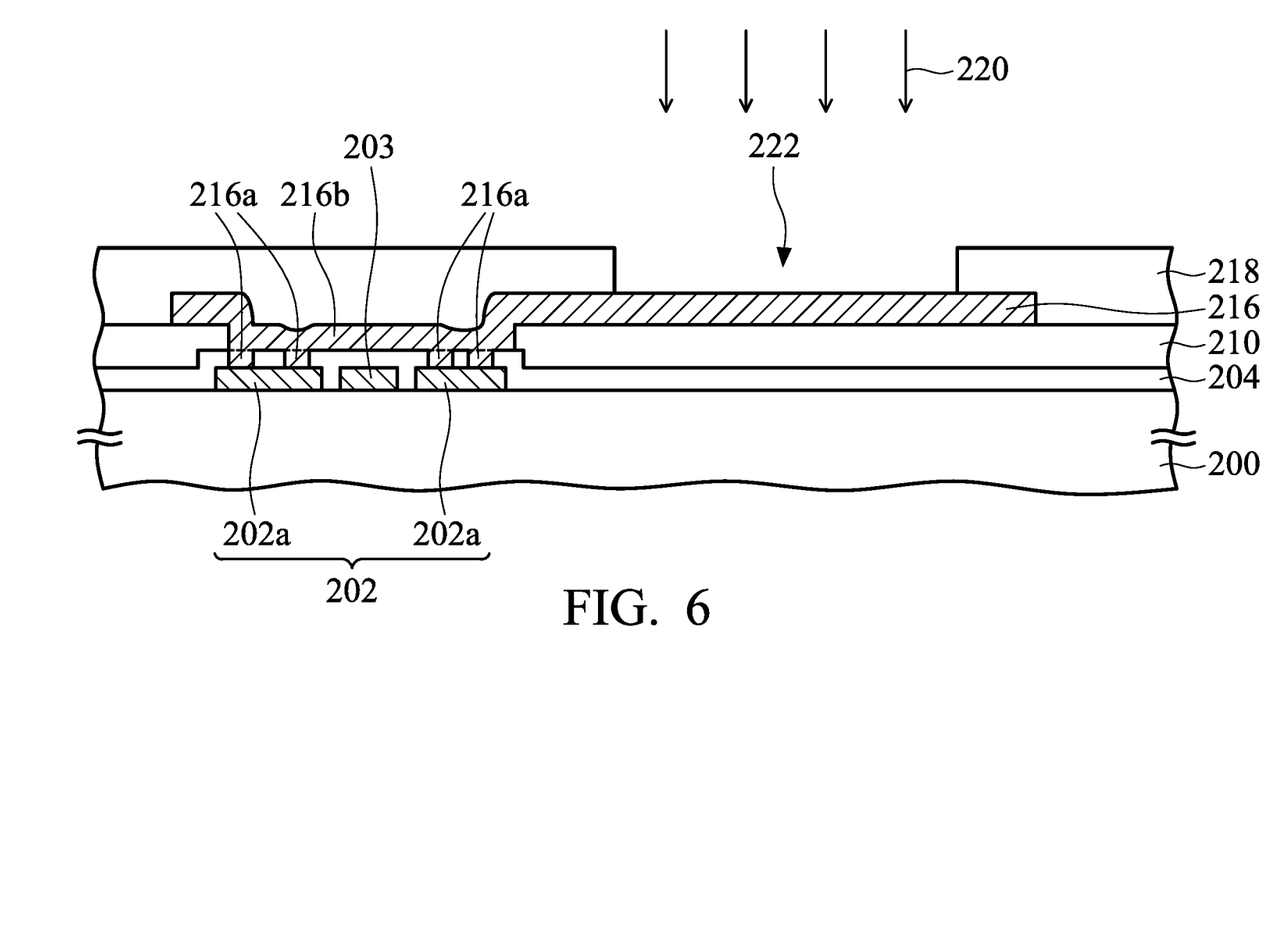

Referring to FIG. 6, a second planarization layer 218 is formed over the top surface of the structure shown in FIG. 5, and a patterning process 220 is next performed on the second planarization layer 218 to form an opening 222 in a portion of the second planarization layer 218, thereby exposing a portion of the patterned redistribution layer 216. The second planarization layer 208 can be formed by chemical vapor deposition (CVD) or spin coating, for example, and may be patterned by the patterning process 220 comprising photolithography and etching steps (not shown) incorporating suitable patterned masks (not shown) as an etching mask. Materials for forming the second planarization layer 218 can be the same as those of the first planarization layer 112 shown in FIG. 1, and the second planarization layer 218 may have a thickness of about 7.5 µm to about 10 µm, which is greater than the thickness of the patterned conductive redistribution layer 216.

Figure 7:
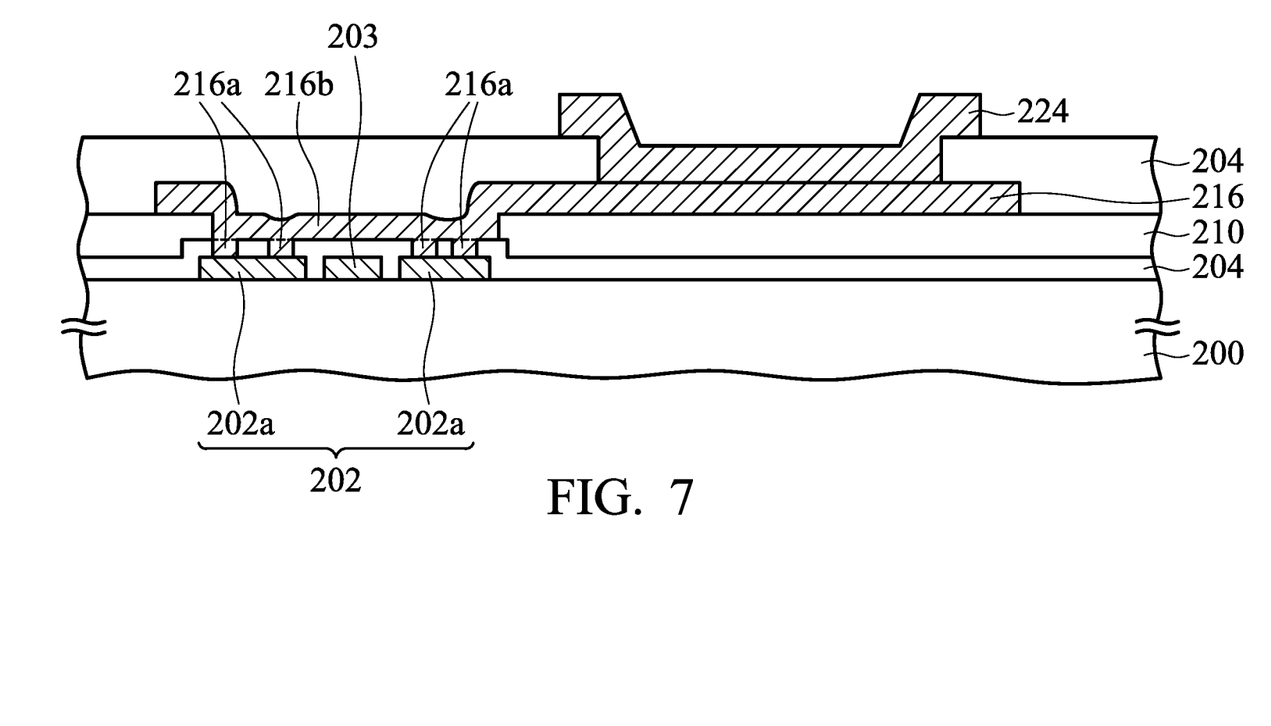

Referring to FIG. 7, an under-bump-metallurgy (UBM) layer 224 is next formed over the portion of the patterned conductive redistribution layer 216 exposed by the opening 222. The UBM layer 218 can be formed by forming a layer of conductive material over the structure shown in FIG. 6 by, for example, chemical vapor deposition (CVD) or electrical plating, and is then patterned by a patterning process (not shown) comprising photolithography and etching steps (not shown) incorporating suitable patterned masks (not shown) as an etching mask. Materials for forming the UBM layer 224 can be the same as that of the UBM layer 116 shown in FIG. 1, and the UBM layer 224 may have a thickness of about µm to about µm.

Figure 8:
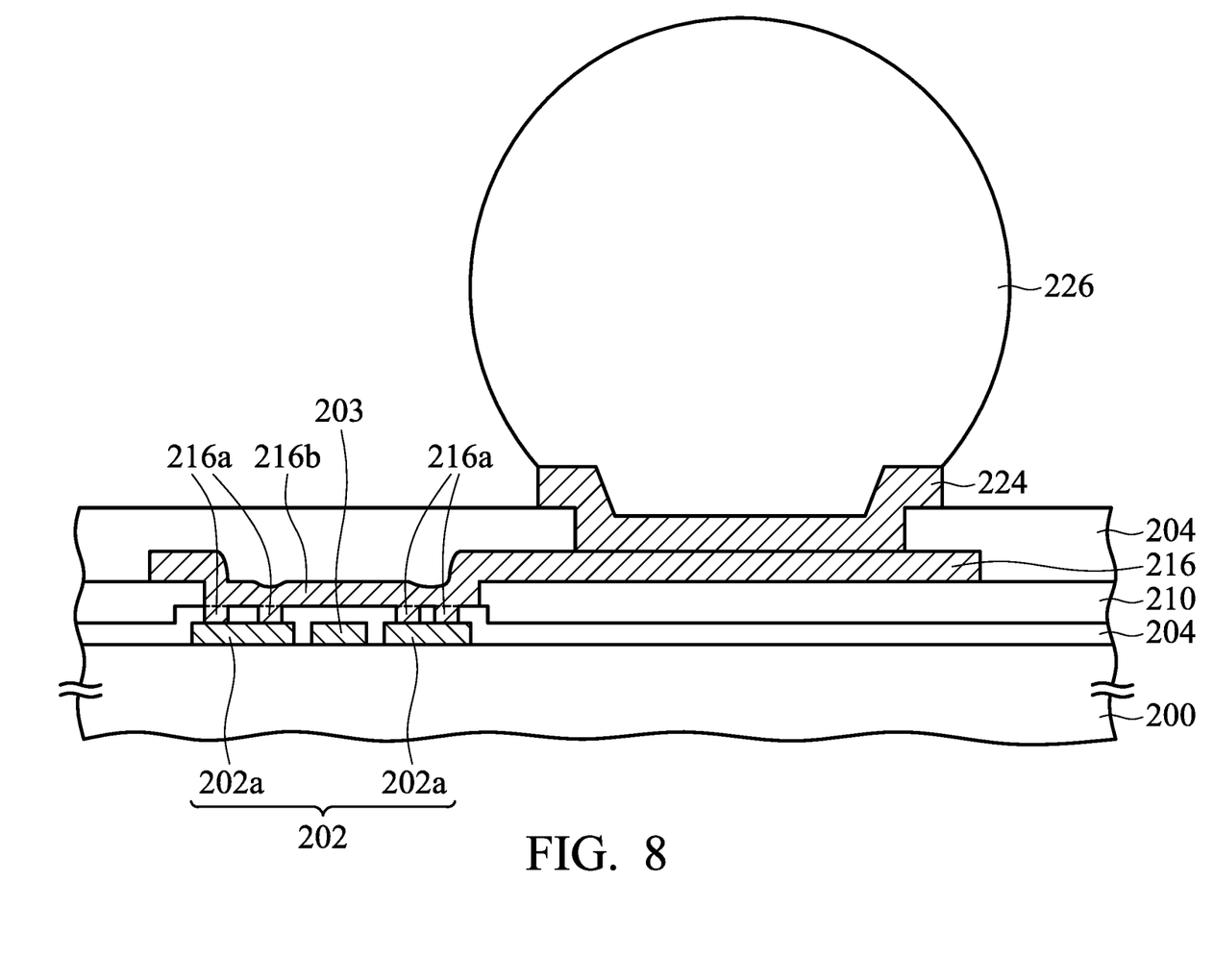

Referring to FIG. 8, a conductive bump 226 is next formed over the UBM layer 224 by conventional solder bump formation processes. The UBM layer 224 and the conductive bump 226 can be sequentially and firmly formed over the patterned conductive redistribution layer 216. Therefore, a wafer-level chip-size package (WLCSP) having an additional conductive component adjacent to the bonding pad is substantially formed.

As shown in FIG. 8, since the wafer-level chip-size package (WLCSP) is provided with an additional conductive component 203 which is electrically isolated from the bonding pad 202 and the patterned redistribution layer 216, such that the conductive component 203 may be designed to function as a signal line, a power line or a ground line that operates in an electrical potential that is different from that of the bonding pad 202 during operation of the WLCSP shown in FIG. 8. In addition, due to formation of the conductive component 203, the size of the conductive segments 202a of the bonding pad 202 can be reduced to a smaller size than the conventional pad 102 shown in FIG. 1. Therefore, the WLCSP shown in FIG. 8 allows for a multifunctional design in a more compact structure, which is desired as the trend continues towards further reduction in the size of integrated circuits in WLCSP.

Figure 9:
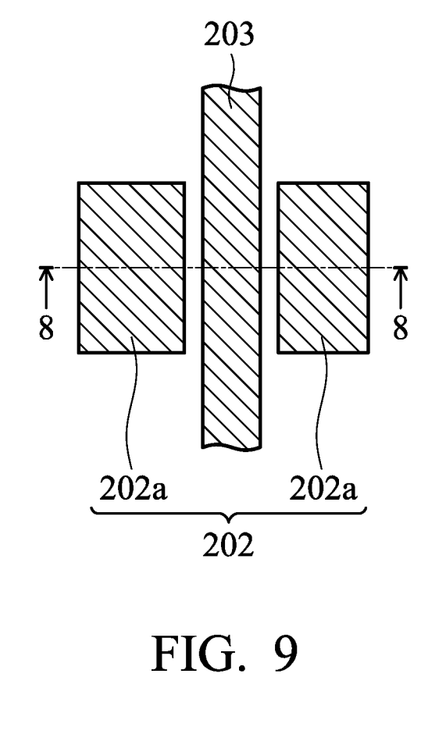
FIG. 9 is a schematic top view showing a region of the wafer-level chip-size package (WLCSP) in FIG. 8.

FIG. 9 is a schematic top view showing a region comprising the bonding pad 202 and the conductive component 203 of the WLCSP shown in FIG. 8. In FIG. 9, only the bonding pad 202 and the conductive component 203 are illustrated but other components are omitted for the ease of showing an arrangement of the bonding pad 202 and the conductive component 203. As shown in FIG. 9, the conductive component 203 is disposed between the conductive segments 202a of the bonding pad 202. The conductive component 203 is formed with a strip-like configuration extending both upward and downward, and the conductive segments 202a of the bonding pad 202 are formed with a pad-like configuration having a maximum size (e.g. length) that is less than that of the conductive component 203.

Figure 10:
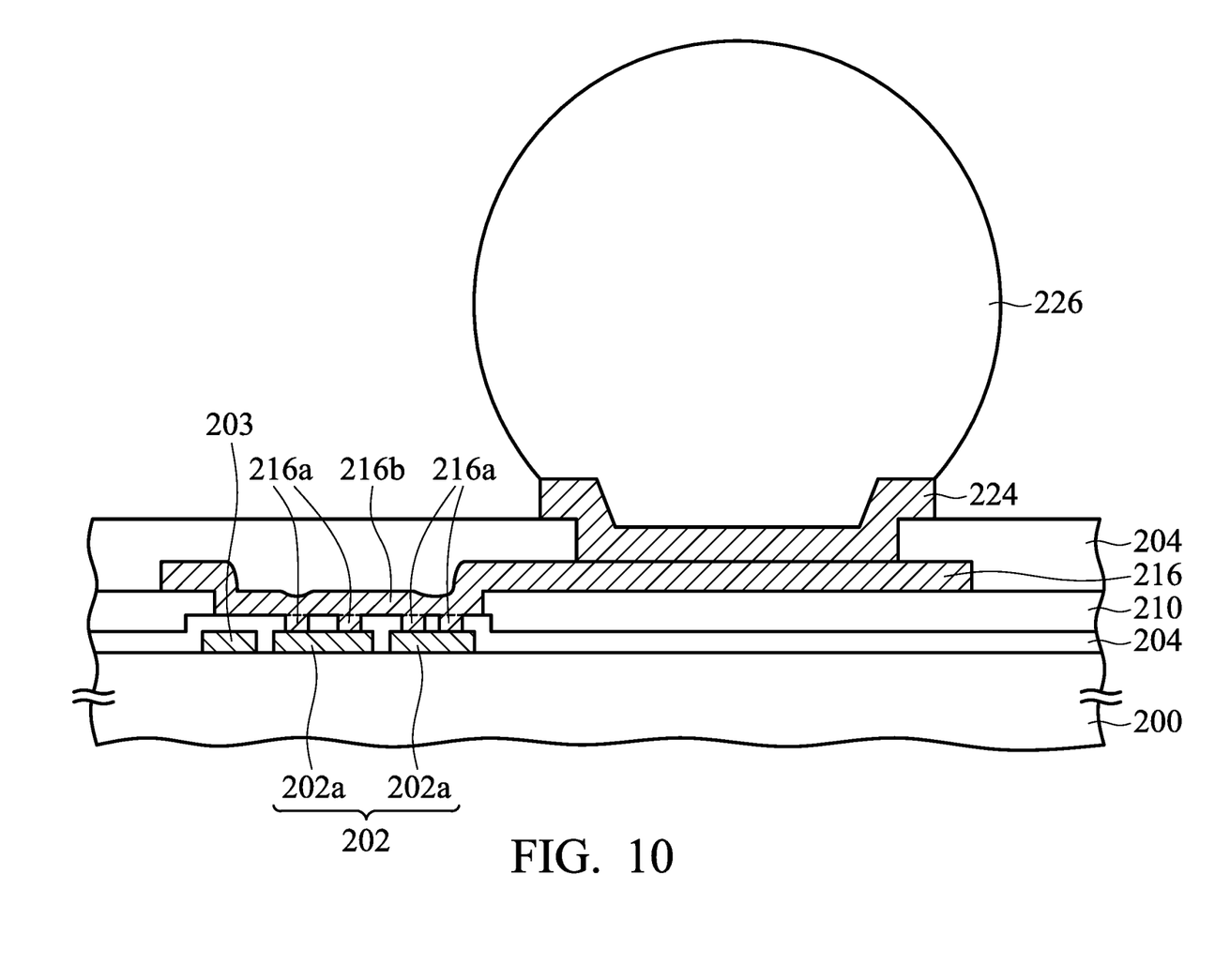
FIG. 10 is a schematic cross section showing a wafer-level chip-size package (WLCSP) according to another embodiment of the present disclosure.

In addition to the exemplary embodiment shown in FIG. 8, FIG. 10 is a schematic cross section showing another exemplary wafer-level chip-size package (WLCSP) of the present disclosure. At this time, the WLCSP shown in FIG. 10 is modified from the WLCSP shown in FIG. 8, and similar components in FIG. 10 are represented with the same reference numbers shown in FIG. 8, and only differences between the WLCSPs shown in FIGS. 8 and 10 are discussed below.

Referring to FIG. 10, the location of the conductive component 203 is switched with one of the conductive segments 202a of the bonding pad 202, such that the conductive component 203 is formed at the left side of the conductive segments 202a of the bonding pad 202. As shown in FIG. 10, the conductive component 203 is adjacent to only one of the conductive segments 202a of the bonding pad 202.

Figure 11:
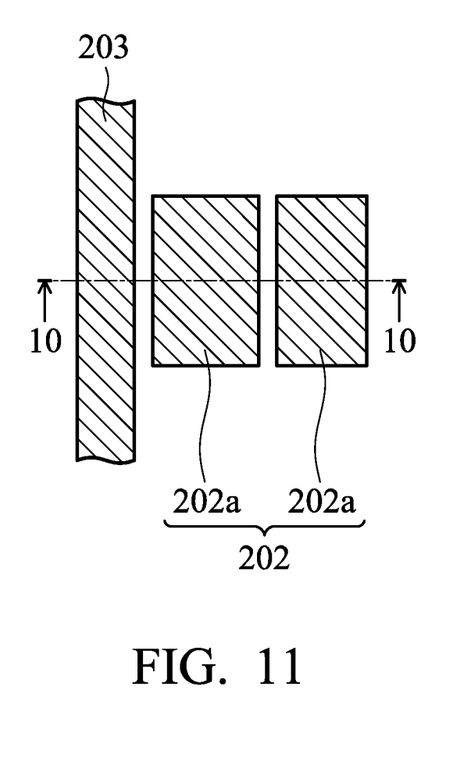
FIG. 11 is a schematic top view showing a region of the wafer-level chip-size package (WLCSP) in FIG. 10.

FIG. 11 is a schematic top view showing a region comprising the bonding pad 202 and the conductive component 203 of the WLCSP shown in FIG. 10. Similarly, in FIG. 11, only the bonding pad 202 and the conductive component 203 are illustrated while other components are omitted for the ease of showing an arrangement of the bonding pad 202 and the conductive component 203. As shown in FIG. 11, the conductive component 203 is disposed at the left side of the conductive segments 202a of the bonding pad 202. The conductive component 203 is formed with a strip-like configuration extending both upward and downward, and the conductive segments 202a of the bonding pad 202 are formed with a pad-like configuration having a maximum dimension (e.g. length) less than that of the conductive component 203.

Figure 12:
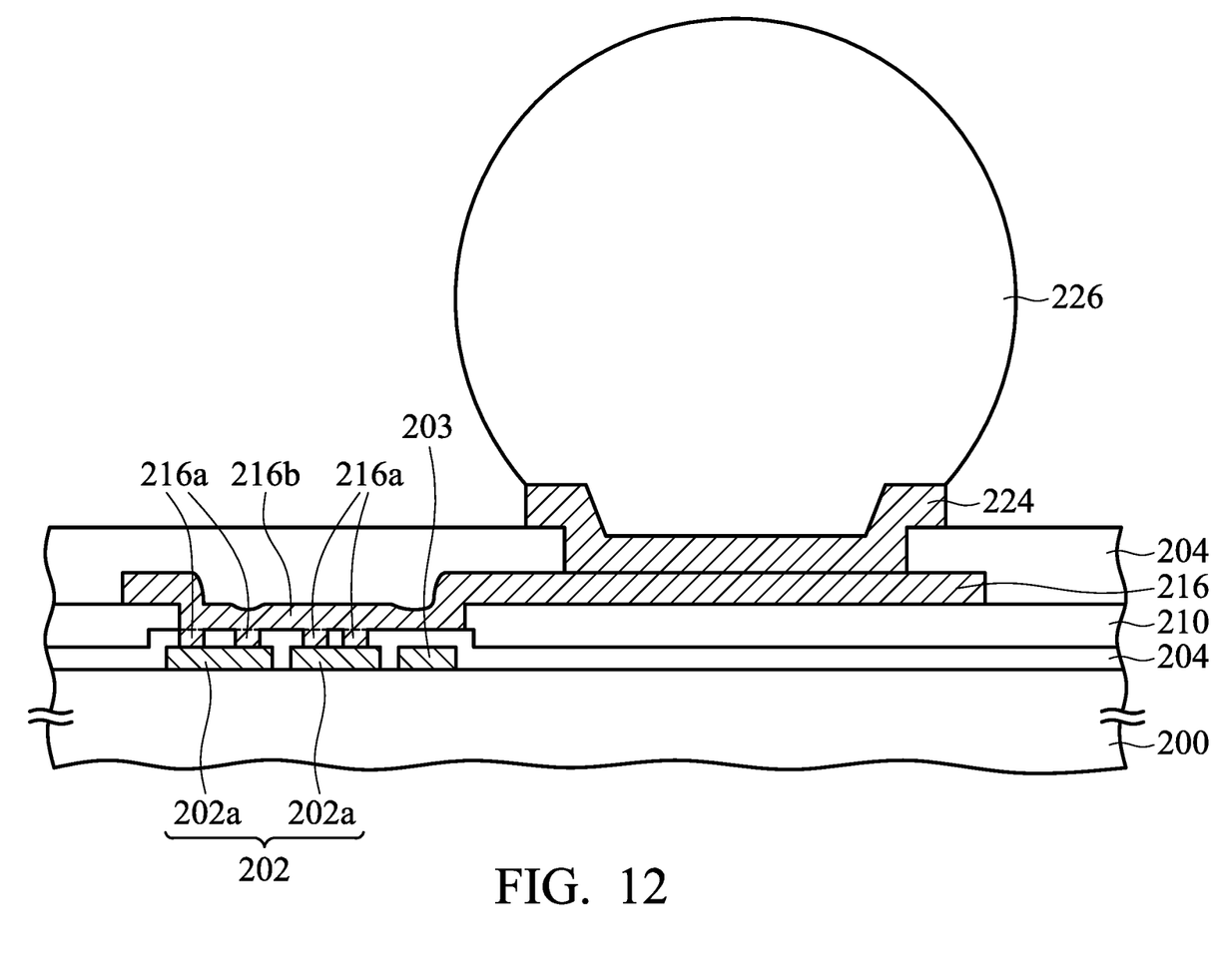
FIG. 12 is a schematic cross section showing a wafer-level chip-size package (WLCSP) according to yet another embodiment of the present disclosure.

Moreover, in addition to the exemplary embodiments shown in FIG. 8, FIG. 12 is a schematic cross section showing yet another exemplary wafer-level chip-size package (WLCSP) of the present disclosure. At this time, the WLCSP shown in FIG. 12 is modified from the WLCSP shown in FIG. 8, and similar components in FIG. 12 are represented with the same reference numbers shown in FIG. 8, and only differences between the WLCSPs shown in FIGS. 8 and 12 are discussed below.

Referring to FIG. 12, the location of the conductive component 203 is switched with one of the conductive segments 202a of the bonding pad 202, such that the conductive component 203 is formed at the right side of the conductive segments 202a of the bonding pad 202. As shown in FIG. 12, the conductive component 203 is adjacent to only one of the conductive segments 202a of the bonding pad 202.

Figure 13:
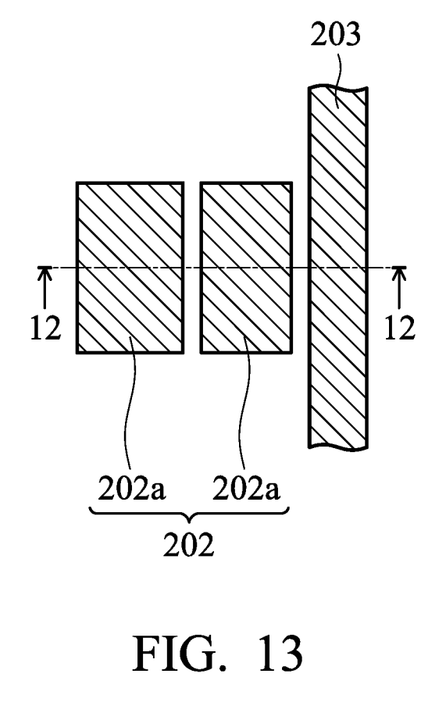
FIG. 13 is a schematic top view showing a region of the wafer-level chip-size package (WLCSP) in FIG. 12.

FIG. 13 is a schematic top view showing a region comprising the bonding pad 202 and the conductive component 203 of the WLCSP shown in FIG. 12. Similarly, in FIG. 13, only the bonding pad 202 and the conductive component 203 are illustrated but other components are omitted for the ease of showing an arrangement of the bonding pad 202 and the conductive component 203. As shown in FIG. 13, the conductive component 203 is disposed at the right side of the conductive segments 202a of the bonding pad 202. The conductive component 203 is formed with a strip-like configuration extending both upward and downward, and the conductive segments 202a of the bonding pad 202 are formed with a pad-like configuration having a maximum dimension (e.g. length) that is less than that of the conductive component 203.

Similarly with the embodiment shown in FIGS. 8-9, since the wafer-level chip-size package (WLCSP) of the embodiments shown in FIGS. 10-12 are also provided with an additional conductive component 203 which is electrically isolated from the bonding pad 202 and the patterned redistribution layer 216, such that the conductive component 203 may be designed to function as a signal line, a power line or a ground line that operates in an electrical potential that is different from that of the bonding pad 202 during operation of the WLCSP shown in FIG. 8. In addition, due to the formation of the conductive component 203, the size of the conductive segments 202a of the bonding pad 202 can be reduced to a smaller size than the conventional pad 102 shown in FIG. 1. Therefore, the WLCSP shown in FIGS. 10-13 allows for a multifunctional design in a more compact structure, which is desired as the trend towards further reduction in the size of integrated circuits in WLCSP continues.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer-level chip-size package, comprising:
   a semiconductor structure;
   a bonding pad formed over the semiconductor structure, comprising a plurality of conductive segments;
   a conductive component formed over the semiconductor structure, being adjacent to the bonding pad and isolated from the bonding pad, wherein the conductive component is disposed between conductive segments of the plurality of the conductive segments of the bonding pad;
   a passivation layer formed over the semiconductor structure, the bonding pad and the conductive component, wherein the passivation layer exposes portions of the plurality of conductive segments of the bonding pad and wherein the passivation layer completely covers the conductive component in cross-section;
   a conductive redistribution layer formed over the passivation layer and the portions of the plurality of conductive segments of the bonding pad exposed by the passivation layer;
   a planarization layer formed over the passivation layer and the conductive redistribution layer, exposing a portion of the conductive redistribution layer;
   an under-bump-metallurgy (UBM) layer formed over the planarization layer and the portion of the conductive redistribution layer exposed by the planarization layer; and
   a conductive bump formed over the UBM layer,
   wherein the bonding pad and the conductive component are completely separated, in a direction parallel to an interface between the UBM layer and the conductive redistribution layer, from a footprint area of the UBM layer.

2. The wafer-level chip-size package as claimed in claim 1, wherein the passivation layer comprises one or more dielectric materials.

3. The wafer-level chip-size package as claimed in claim 1, wherein the planarization layer comprises polyimide, polybenzoxazole or benzocyclobutene.

4. The wafer-level chip-size package as claimed in claim 1, wherein the portions of the plurality of conductive segments of the bonding pad exposed by the passivation layer have a size of about 2 μm to about 90 μm.

5. The wafer-level chip-size package as claimed in claim 1, wherein the portions of the plurality of conductive segments of the bonding pad exposed by the passivation layer respectively have a circular, stripe-like, or polygonal shape.

6. The wafer-level chip-size package as claimed in claim 1, wherein the conductive component has a strip-like configuration from a top view.

* * * * *